(12) United States Patent
Liang et al.

(10) Patent No.: US 9,896,326 B2
(45) Date of Patent: Feb. 20, 2018

(54) FCVD LINE BENDING RESOLUTION BY DEPOSITION MODULATION

(71) Applicant: Applied Materials, Inc., Santa Clara, CA (US)

(72) Inventors: Jingmei Liang, San Jose, CA (US); Kiran V. Thadani, Sunnyvale, CA (US); Jessica S. Kachian, Sunnyvale, CA (US); Nagarajan Rajagopalan, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 14/954,634

(22) Filed: Nov. 30, 2015

(65) Prior Publication Data

US 2016/0181089 A1    Jun. 23, 2016

Related U.S. Application Data

(60) Provisional application No. 62/095,518, filed on Dec. 22, 2014.

(51) Int. Cl.
*H01L 21/02*    (2006.01)
*B81B 3/00*    (2006.01)
(Continued)

(52) U.S. Cl.
CPC .............. *B81B 3/00* (2013.01); *C23C 16/401* (2013.01); *C23C 16/505* (2013.01);
(Continued)

(58) Field of Classification Search
CPC .................... H01L 21/02205; H01L 21/02271
See application file for complete search history.

(56) References Cited

U.S. PATENT DOCUMENTS 7,867,923 B2    1/2011   Mallick et al.
8,318,584 B2    11/2012  Li et al.
(Continued)

FOREIGN PATENT DOCUMENTS

JP      2004193286 A    7/2004
KR      1020100050788   5/2010

OTHER PUBLICATIONS

International Search Report and Written Opinion for International Application No. PCT/US2015/063189 dated Feb. 25, 2016.

*Primary Examiner* — Allen Parker
*Assistant Examiner* — Stephen Bradley
(74) *Attorney, Agent, or Firm* — Patterson + Sheridan, LLP

(57) ABSTRACT

A method of reducing line bending and surface roughness of a substrate with pillars includes forming a treated surface by treating a pillar-containing substrate with a radical. The radical may be silicon-based, nitrogen-based or oxygen-based. The method may include forming a dielectric film over the treated surface by reacting an organosilicon precursor and an oxygen precursor. The method may include curing the dielectric film at a temperature of about 150° C. or less. A method of reducing line bending and surface roughness of a substrate with pillars includes forming a dielectric film over a pillar-containing substrate by reacting an organosilicon precursor, an oxygen precursor, and a radical precursor. The method may include curing the dielectric film at a temperature of about 150° C. or less. The radical precursor may be selected from the group consisting of nitrogen-based radical precursor, oxygen-based radical precursor, and silicon-based radical precursor.

13 Claims, 3 Drawing Sheets

(51) Int. Cl.
*C23C 16/40* (2006.01)
*C23C 16/505* (2006.01)
*C23C 16/452* (2006.01)
*C23C 16/455* (2006.01)

(52) U.S. Cl.
CPC .. *H01L 21/02126* (2013.01); *H01L 21/02274* (2013.01); *H01L 21/02315* (2013.01); *C23C 16/452* (2013.01); *C23C 16/45565* (2013.01)

(56) References Cited

U.S. PATENT DOCUMENTS

| | | | |
|---|---|---|---|
| 8,449,942 B2 | 5/2013 | Liang et al. | |
| 8,741,788 B2 | 6/2014 | Liang et al. | |
| 2004/0129385 A1* | 7/2004 | Wise | H01J 37/32192 156/345.35 |
| 2007/0032092 A1 | 2/2007 | Shibata et al. | |
| 2007/0281106 A1* | 12/2007 | Lubomirsky | C23C 16/401 427/569 |
| 2009/0104791 A1* | 4/2009 | Nemani | C23C 16/045 438/788 |
| 2009/0208880 A1* | 8/2009 | Nemani | G03F 7/0757 430/323 |
| 2011/0011338 A1 | 1/2011 | Chuc et al. | |
| 2011/0315319 A1* | 12/2011 | Forster | H01J 37/32082 156/345.29 |
| 2012/0149213 A1* | 6/2012 | Nittala | C23C 16/02 438/783 |
| 2012/0156890 A1* | 6/2012 | Yim | H01L 21/02126 438/763 |
| 2012/0219727 A1* | 8/2012 | Gandhiraman | B01L 3/502707 427/563 |
| 2013/0288485 A1* | 10/2013 | Liang | H01L 21/02282 438/782 |
| 2013/0309870 A1* | 11/2013 | Hong | H01L 21/02164 438/700 |
| 2014/0231384 A1 | 8/2014 | Underwood et al. | |
| 2014/0273452 A1 | 9/2014 | Blomberg et al. | |
| 2015/0380302 A1* | 12/2015 | Mountsier | H01L 21/76831 438/654 |
| 2016/0148800 A1* | 5/2016 | Henri | H01L 21/0228 438/485 |

* cited by examiner

FCVD LINE BENDING RESOLUTION BY DEPOSITION MODULATION

CROSS-REFERENCE TO RELATED APPLICATIONS

This application claims benefit of U.S. Provisional Patent Application No. 62/095,518, filed Dec. 22, 2014, which is incorporated by reference in its entirety.

FIELD

Embodiments of the present disclosure generally relate to surface-treating and forming dielectric films.

BACKGROUND

As device nodes shrink, narrow and high aspect ratio pillars become mechanically fragile and are susceptible to bending with stress or force imbalance during deposition. For example, silicon oxide pillars with high aspect ratio may be susceptible to such bending. The stress or force imbalance around the slender pillars may be caused by capillary force with a flowable chemical vapor deposition (FCVD) meniscus profile, stiction force between FCVD deposition and the substrate (e.g., caused by intermolecular interactions between dangling bonds), and/or localized stress due to surface roughness.

FIG. 1 is a schematic cross-sectional view that illustrates a portion of a semiconductor device 100 in which line bending has occurred between two pillars within the semiconductor device 100. As shown in FIG. 1, the high aspect ratio device structures are formed on a surface of a substrate. During processing, device pillars 102 should remain in a vertical orientation and walls 106 should not cross the openings 104 and contact adjacent walls 106 of the pillars 102. The walls 106 of the pillars 102 are subjected to capillary forces which cause the walls 106 of adjacent pillars 102 to bend towards one another and contact each other. Line bending results from the contact between walls 106 of adjacent pillars 102, ultimately causing closure of the openings 104. Stiction, for example, occurs at least at interaction points 108 between adjacent pillars. Line bending in general, and line stiction in particular, is undesirable because, for example, it prevents access to the openings 104 during subsequent substrate processing steps, such as further deposition steps.

Capillary forces also cause bending of materials in these structures which can create the undesired stiction, which can damage the semiconductor substrate. The aforementioned drawbacks are especially apparent on substrates with high-aspect-ratio semiconductor pillars during deposition processes occurring on the substrate. Line bending results from bending of the side walls, which form the high-aspect-ratio trench or via, towards each other due to capillary pressure across the liquid-air interface over the liquid trapped in the trench or via. Such line bending also occurs due to high aspect ratio of the pillars and elastic constant of the pillar itself. Features with narrow line width and high-aspect-ratios are susceptible to the difference in surface tension created between liquid-air and liquid-wall interfaces due to capillary pressure, which is also sometimes referred to as capillary force.

During deposition, uneven distribution of a relatively viscous flowable film into the openings 104 between each of the pillars also leads to further line bending due to the lack of flowability of the deposited film in between each of the pillars. Uneven distribution of deposition may also give rise to initial surface roughness of the film deposited in between each of the pillars. Line bending may also occur by non-uniform reaction of the surface of the film deposited in between the pillars with native oxide. Semiconductor processing is facing a steeply rising challenge in preventing line bending as a result of rapid device scaling advancements.

As a result, there is a need in the art for FCVD processes which reduce or eliminate line bending and localized stress due to deposition roughness.

SUMMARY

In one embodiment for a 300 mm substrate, a method of reducing line bending and surface roughness of a substrate with pillars includes forming a treated surface by treating a pillar-containing substrate with a radical at a temperature between about 50° C. and about 800° C. at a pressure between about 10 mTorr and about 20 Torr. The radical may be silicon-based, nitrogen-based, or oxygen-based and the radical may be introduced into a processing region at a flow rate between about 0.1 sccm and about 10,000 sccm. The method may include forming a dielectric film over the treated surface by reacting an organosilicon precursor and an oxygen precursor at a temperature of about 100° C. or less and a pressure between about 0.5 Torr and about 10 Torr. The organosilicon precursor may be introduced into a processing region at a flow rate between about 10 sccm and about 1800 sccm, and the oxygen precursor may be introduced into the processing region at a flow rate between about 10 mgm and about 1,500 mgm. The method may include curing the dielectric film at a temperature of about 150° C. or less.

In one embodiment, a method of reducing line bending and surface roughness of a substrate with pillars includes forming a dielectric film over a pillar-containing substrate by reacting an organosilicon precursor, an oxygen precursor, and a radical precursor at a temperature of about 100° C. or less at a pressure between about 0.5 Torr and about 10 Torr. The organosilicon precursor may be introduced into a processing region at a flow rate between about 10 sccm and about 1800 sccm. The oxygen precursor may be introduced into the processing region at a flow rate between about 10 mgm and about 1,500 mgm. The radical precursor may be introduced to a radical source at a flow rate between about 600 sccm and about 1,250 sccm. The method may include curing the dielectric film at a temperature of about 150° C. or less. The radical precursor may be selected from the group consisting of nitrogen-based radical precursor, oxygen-based radical precursor, and silicon-based radical precursor.

BRIEF DESCRIPTION OF THE DRAWINGS

So that the manner in which the above recited features of the present disclosure can be understood in detail, a more particular description of the subject matter, briefly summarized above, may be had by reference to implementations, some of which are illustrated in the appended drawings. It is to be noted, however, that the appended drawings illustrate only typical implementations of the present disclosure and are therefore not to be considered limiting of its scope, for the claimed subject matter may admit to other equally effective implementations.

Figure 1:
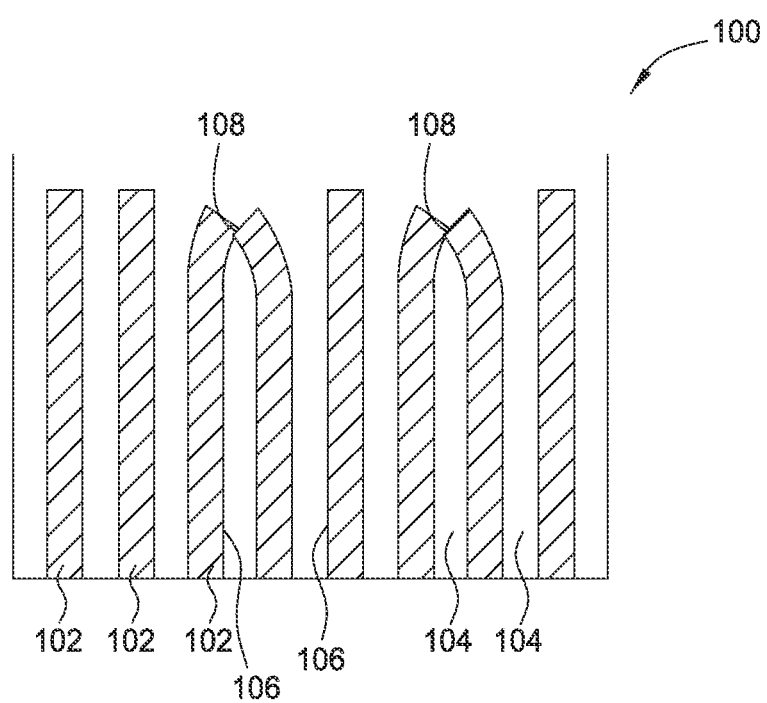
FIG. 1 illustrates the effect of line bending created between pillars formed within a semiconductor device structure formed on a substrate due to the creation of a capillary force.

To facilitate understanding, identical reference numerals have been used, where possible, to designate identical elements that are common to the figures. It is contemplated that elements disclosed in one implementation may be beneficially utilized on other implementations without specific recitation. The drawings referred to here should not be understood as being drawn to scale unless specifically noted. Also, the drawings are often simplified and details or components omitted for clarity of presentation and explanation. The drawings and discussion serve to explain principles discussed below, where like designations denote like elements.

DETAILED DESCRIPTION

In the following description, for purposes of explanation, numerous specific details are set forth in order to provide a thorough understanding of the implementations provided herein. However, it will be evident to one skilled in the art that the present disclosure may be practiced without these specific details. In other instances, specific apparatus structures have not been described so as not to obscure implementations described. The following description and figures are illustrative of the implementations and are not to be construed as limiting the claimed subject matter.

As described herein, a pillar-containing substrate may have a plurality of spaces for the spacing and structure of pillars formed on the substrate. The spaces may have a height and width that define an aspect ratio of the height to the width (i.e., H/W) that is significantly greater than 1:1 (e.g., between 5:1 or to 25:1 or more).

Figure 2:
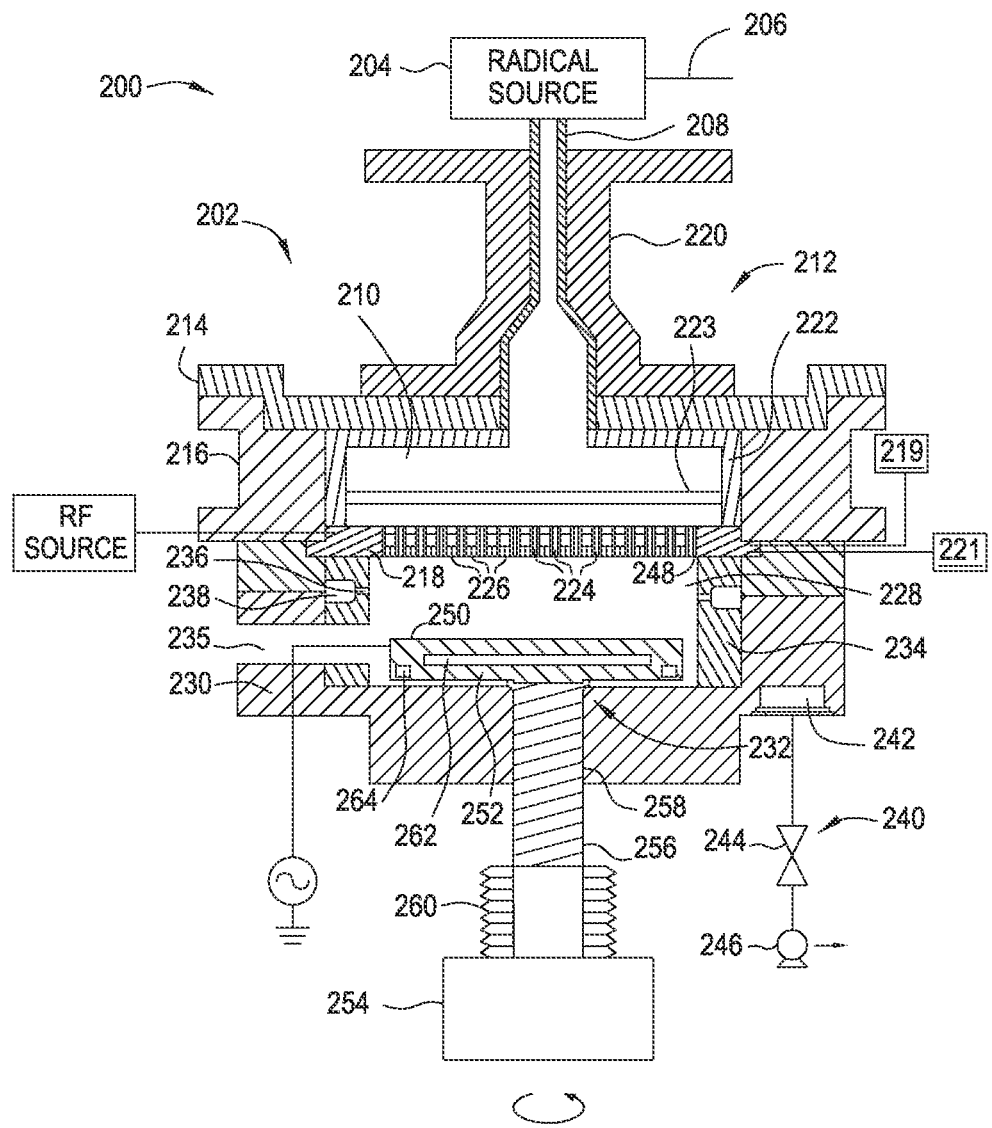
FIG. 2 is a cross sectional view of an apparatus according to one implementation.

FIG. 2 is a cross sectional view of an apparatus 200 for silane-based and/or radical-based surface treatment of dielectric films/substrates according to an implementation of the present disclosure. As shown in FIG. 2, the apparatus 200 includes a processing chamber 202 comprising a body 230 and a radical source 204 coupled to the body 230. The radical source 204 may be any suitable source that is capable of generating radicals. The radical source 204 may be a remote plasma source, such as a radio frequency (RF) or very high radio frequency (VHRF) capacitively coupled plasma (CCP) source, an inductively coupled plasma (ICP) source, a microwave induced (MW) plasma source, a DC glow discharge source, an electron cyclotron resonance (ECR) chamber, or a high density plasma (HDP) chamber. Alternatively, the radical source 204 may be an ultraviolet (UV) source or the filament of a hot wire chemical vapor deposition (HW-CVD) chamber. The radical source 204 may include one or more gas inlets 206 and the radical source 204 may be coupled to the processing chamber 202 by a radical conduit 208.

One or more process gases, which may be radical-forming gases, and which may be a gas mixture, may enter the radical source 204 via the one or more gas inlets 206. The one or more process gases may comprise an oxygen-containing and/or nitrogen-containing gas, such as oxygen, $H_2O$, hydrogen peroxide, and/or ammonia. Alternatively or in addition to the oxygen-containing and/or nitrogen-containing gases, the process gases may comprise a silicon-containing gas. Examples of the silicon-containing gas include organosilicon, tetraalkyl orthosilicate gases and disiloxane.

Organosilicon gases include gases of organic compounds having at least one carbon-silicon bond. Tetraalkyl orthosilicate gases include gases consisting of four alkyl groups attached to an $SiO_4^{4-}$ ion. More particularly, the one or more precursor gases may be (dimethylsilyl)(trimethylsilyl)methane $((Me)_3SiCH_2SiH(Me)_2)$, hexamethyldisilane $((Me)_3SiSi(Me)_3)$, trimethylsilane $((Me)_3SiH)$, trimethylsilylchloride $((Me)_3SiCl)$, tetramethylsilane $((Me)_4Si)$, tetraethoxysilane $((EtO)_4Si)$, tetramethoxysilane $((MeO)_4Si)$, tetrakis-(trimethylsilyl)silane $((Me_3Si)_4Si)$, (dimethylamino) dimethylsilane $((Me_2N)SiHMe_2)$ dimethyldiethoxysilane $((EtO)_2Si(Me)_2)$, dimethyldimethoxysilane $((MeO)_2Si(Me)_2)$, methyltrimethoxysilane $((MeO)_3Si(Me))$, dimethoxytetramethyl-disiloxane $(((Me)_2Si(OMe))_2O)$, tris(dimethylamino)silane $((Me_2N)_3SiH)$, bis(dimethylamino)methylsilane $((Me_2N)_2CH_3SiH)$, disiloxane $((SiH_3)_2O)$, and combinations thereof.

Silicon-containing gases may react with the surface of the substrate, for example with dangling Si—OH bonds, to form a silicon-functionalized substrate surface. Alternatively or in addition, silicon-containing gases may form a conformal silicon layer on the substrate. The silicon-functionalized and/or silicon-deposited substrate surface reduces intermolecular interactions, such as hydrogen bonding, between adjacent pillars as compared to, for example, Si—OH dangling bonds of an untreated surface. Nitrogen-containing gases and oxygen-containing gases may have a similar effect on an untreated substrate surface.

The one or more process gases may comprise an inert gas, such as argon. Radicals generated in the radical source 204, such as oxygen, nitrogen, or silicon radicals, travel into the processing chamber 202 through the radical conduit 208. Processing conditions may be optimized in order to achieve a desired uniformity of nitrogen, oxygen, and/or silicon substrate surface content.

The radical conduit 208 is a part of a lid assembly 212, which also includes a radical cavity 210, a top plate 214, a lid rim 216, and a dual-channel showerhead 218. The radical conduit 208 may comprise a material that is substantially unreactive to radicals. For example, radical conduit 208 may comprise AlN, $SiO_2$, $Y_2O_3$, MgO, anodized $Al_2O_3$, sapphire, ceramic containing one or more of $Al_2O_3$, sapphire, AlN, $Y_2O_3$, MgO, or plastic. A representative example of a suitable $SiO_2$ material is quartz. Alternatively or additionally, radical conduit 208 may have a coating on the surface that contacts the radicals in operation. The coating may also comprise AlN, $SiO_2$, $Y_2O_3$, MgO, anodized $Al_2O_3$, sapphire, ceramic containing one or more of $Al_2O_3$, sapphire, AlN, $Y_2O_3$, MgO, or plastic. If a coating is used, the thickness of the coating may be between about 1 μm and about 1 mm. The coating may be applied using a spray coating process. The radical conduit 208 may be disposed within and supported by a radical conduit support member 220. The radical conduit support member 220 may be disposed on the top plate 214, which rests on the lid rim 216.

The radical cavity 210 is positioned below and coupled to the radical conduit 208, and the radicals generated in the radical source 204 travel to the radical cavity 210 through the radical conduit 208. Directional terms herein, such as "below", "upper", "lower", "top" or "bottom", etc., are relative to a basis plane of the chamber and are not an absolute direction. Radical cavity 210 is defined by the top plate 214 coupled with the lid rim 216 that is coupled with the dual-channel showerhead 218. Optionally, the radical cavity 210 may include a liner 222. The liner 222 may cover surfaces of the top plate 214 and the lid rim 216 that are within the radical cavity 210. The liner 222 may comprise a material that is substantially unreactive to radicals. For example, the liner 222 may comprise AlN, $SiO_2$, $Y_2O_3$, MgO, anodized $Al_2O_3$, sapphire, ceramic containing one or more of $Al_2O_3$, sapphire, AlN, $Y_2O_3$, MgO, or plastic. Alternatively or in addition to, the surfaces of the radical cavity 210 that are in contact with radicals may be composed of or coated with a material that is substantially unreactive to radicals. For example, the surfaces may be composed of or coated with AlN, $SiO_2$, $Y_2O_3$, MgO, anodized $Al_2O_3$, sapphire, ceramic containing one or more of $Al_2O_3$, sapphire, AlN, $Y_2O_3$, MgO, or plastic. If a coating is used, the thickness of the coating may be between about 1 μm and about 1 mm. By not consuming the generated radicals, the radical flux to a substrate disposed in the processing chamber 202 is increased.

In general, activated gases generated by, for example, an energetic excitation of gaseous molecules consisting of a plasma of charged ions, radicals, and electrons. In some processes where radicals of a plasma are desirable (as they react in a much more desirable manner with silicon or polysilicon material on a substrate than ions or a mixture of radicals and ions), radical distribution plate 223 may act as an ion filter, such as electrostatic filters, wire or mesh filters, or magnetic filters, used between top plate 214 and the dual-channel showerhead 218 to eliminate the majority or substantially all of the ions of the plasma such that only radicals of the plasma flow through the dual-channel showerhead 218 and react with silicon or polysilicon material on the substrate, thereby obtaining a greater selectivity of processing of substrate surface. In cases where radical source 204 radicals flow through the dual-channel showerhead 218, the dual-channel showerhead 218 may be turned on with small amount of power to boost radical regeneration to compensate radical loss due to the flow path, or to change radical composition by using different RF frequency and other parameters. Alternatively, the electrodes of the dual-channel showerhead 218 may not be powered so that the radicals of the plasma from the radical source 204 bypass the dual-channel showerhead 218 to avoid or minimize undesired reaction occurred in the processing region 228.

The radical distribution plate 223 may be made of the same material as the liner 222 or may be coated with the same material as the liner 222. The radical distribution plate 223 may be used to control the radical flow profile. The location of the radical distribution plate 223 in the radical cavity 210, i.e., the distance between the radical distribution plate 223 and the top plate 214, and the distance between the radical distribution plate 223 and the dual-channel showerhead 218, may also be adjusted to affect radical distribution.

The radical distribution plate 223 may comprise a plurality of holes that may be configured to control the passage of the activated gas (i.e., the ionic, radical, and/or neutral species) through the radical distribution plate 223. For example, the aspect ratio of the holes (i.e., the hole diameter to length) and/or the geometry of the holes may be controlled so that the flow of ionically-charged species in the activated gas passing through the radical distribution plate 223 is reduced. The holes in the radical distribution plate 223 may include, for example, a cylindrical portion that faces top plate 214, and a tapered portion that faces dual-channel showerhead 218. The cylindrical portion may be shaped and dimensioned to control the flow of ionic species passing to the dual-channel showerhead 218. An adjustable electrical bias may also be applied to the radical distribution plate 223 as an additional means to control the flow of ionic species through the radical distribution plate 223. Controlling the amount of ionic species passing through the radical distribution plate 223 provides increased control over the activated gas brought into contact with the underlying substrate, which in turn increases control of the surface treatment characteristics of the gas mixture. For example, adjustments in the ion concentration of the gas mixture can shift the balance of conformal-to-flowable of a deposited dielectric material.

Radicals then pass through a plurality of holes 224 disposed in the dual-channel showerhead 218 to enter into a processing region 228. The dual-channel showerhead 218 further includes a plurality of openings 226 that are smaller in diameter than the plurality of holes 224.

Figure 3:
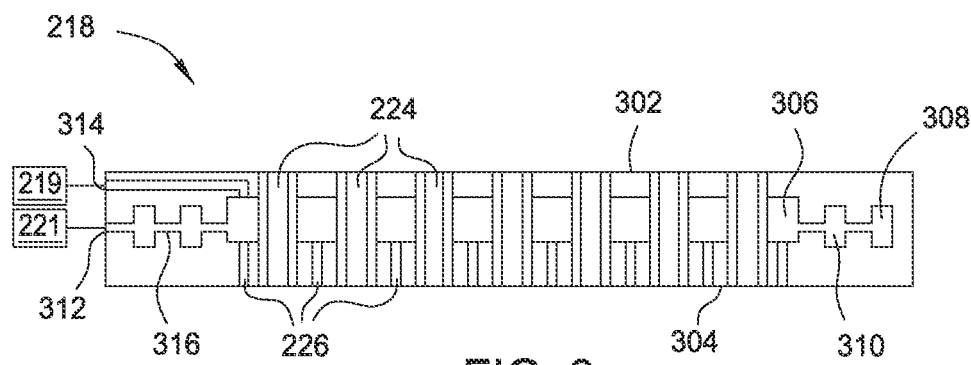
FIG. 3 is a cross-sectional view of a dual-channel showerhead usable in the apparatus in FIG. 2.

The plurality of openings 226 are connected to an internal volume (not shown) that is not in fluid communication with the plurality of holes 224. At least two gas/radical sources 219, 221 may be coupled to the dual-channel showerhead 218. The dual-channel showerhead 218 may be heated or cooled. In one implementation, the dual-channel showerhead 218 is heated to a temperature of about 100 degrees Celsius to about 600 degrees Celsius. In another embodiment, the dual-channel showerhead 218 is cooled to a temperature of about 25 degrees Celsius to about 75 degrees Celsius. One or more heating elements (not shown) and/or a cooling channel (not shown) may be embedded in the dual-channel showerhead 218. The heating elements and cooling channel may be used to control the temperature of the dual-channel showerhead 218 during operation. The heating elements may be any suitable heating elements, such as one or more resistive heating elements. The heating elements may be connected to one or more power sources (not shown). A coolant may flow through the channel to cool the dual-channel showerhead 218. The dual-channel showerhead 218 is described in more detail below (FIG. 3).

The processing chamber 202 may include the lid assembly 212, a body 230 and a support assembly 232. The support assembly 232 may be at least partially disposed within the body 230. The body 230 may include a slit valve opening 235 to provide access to the interior of the processing chamber 202. The body 230 may include a liner 234 that covers the interior surfaces of the body 230. The liner 234 may include one or more apertures 236 and a pumping channel 238 formed therein that is in fluid communication with a vacuum system 240. The apertures 236 provide a flow path for gases into the pumping channel 238, which provides an egress for the gases within the processing chamber 202. Alternatively, the apertures and the pumping channel may be disposed in the bottom of the body 230, and the gases may be pumped out of the processing chamber 202 from the bottom of the body 230. Directional terms herein, such as "below", "upper", "lower", "top" or "bottom", etc., are relative to a basis plane of the chamber and are not an absolute direction.

The vacuum system 240 may include a vacuum port 242, a valve 244 and a vacuum pump 246. The vacuum pump 246 is in fluid communication with the pumping channel 238 via the vacuum port 242. The apertures 236 allow the pumping channel 238 to be in fluid communication with the processing region 228 within the body 230. The processing region 228 is defined by a lower surface 248 of the dual-channel showerhead 218 and an upper surface 250 of the support assembly 232, and the processing region 228 is surrounded by the liner 234. Directional terms herein, such as "below", "upper", "lower", "top" or "bottom", etc., are relative to a basis plane of the chamber and are not an absolute direction.

The support assembly 232 may include a support member 252 to support a substrate (not shown) for processing within the body 230. The substrate may be any standard size, such as, for example, 300 mm. Alternatively, the substrate may be larger than 300 mm, such as 450 mm or larger. The support member 252 may comprise AlN or aluminum depending on operating temperature. The support member 252 may be configured to chuck the substrate and the support member 252 may be an electrostatic chuck or a vacuum chuck.

The support member 252 may be coupled to a lift mechanism 254 through a shaft 256 which extends through a centrally-located opening 258 formed in a bottom surface of the body 230. The lift mechanism 254 may be flexibly sealed to the body 230 by bellows 260 that prevents vacuum leakage from around the shaft 256. The lift mechanism 254 allows the support member 252 to be moved vertically within the body 230 between a process position and a lower, transfer position. The transfer position is slightly below the opening of the slit valve 235. During operation, the spacing between the substrate and the dual-channel showerhead 218 may be minimized in order to maximize radical flux at the substrate surface. For example, the spacing may be between about 100 mm and about 5,000 mm. The lift mechanism 254 may be configured to rotate the shaft 256 via a rotor (not shown) coupled to the support member 252, which in turn rotates the support member 252, causing the substrate disposed on the support member 252 to be rotated during operation. Rotation of the substrate helps improving surface treatment uniformity.

One or more heating elements 262 and a cooling channel 264 may be embedded in the support member 252. The heating elements 262 and cooling channel 264 may be used to control the temperature of the substrate during operation. The heating elements 262 may be any suitable heating elements, such as one or more resistive heating elements. The heating elements 262 may be connected to one or more power sources (not shown). The heating elements 262 may be controlled individually to have independent heating and/or cooling control on multi-zone heating or cooling. With the ability to have independent control on multi-zone heating and cooling, the substrate temperature profile can be enhanced under various process conditions. A coolant may flow through the channel 264 to cool the substrate. The support member 252 may further include gas passages extending to the upper surface 250 for flowing a cooling gas to the backside of the substrate.

The chamber 202 may comprise an RF source. An RF source may be coupled to either the dual-channel showerhead 218 or the support member 252. The RF source may be low frequency, high frequency, or very high frequency. In one embodiment, the dual-channel showerhead 218 is coupled to the RF source and the support member 252 is grounded, as shown in FIG. 2. In another embodiment, the dual-channel showerhead 218 is grounded and the support member 252 is coupled to the RF source. In either embodiment, a capacitively coupled plasma may be formed in the processing region 228 between the dual-channel showerhead 218 and the support member 252 during operation. The capacitively coupled plasma formed in the processing region 228 may be in addition to the plasma formed in the radical source when the radical source is a remote plasma source. The support member 252 may be biased with a DC source to increase activated gas bombardment. Thus, the processing chamber 202 may be a PECVD/FCVD chamber, and the apparatus 200 is capable to perform cyclic processes (alternating radical based PECVD/FCVD).

Alternatively or in addition to the radicals supplied via the radical source 204, one or more of the nitrogen-containing, oxygen-containing, and silicon-containing gases may be supplied to the substrate for surface treatment via dual-channel showerhead 218. FIG. 3 is a cross sectional view of the dual-channel showerhead 218 according to implementations described herein. The dual-channel showerhead 218 may have a first surface 302 that is facing the radical cavity 210 and a second surface 304 opposite the first surface 302. The second surface 304 may be facing the support assembly 232. The first surface 302 may be spaced from the second surface 304 to provide an internal volume 306. The first and second surfaces 302, 304 may be composed of or coated with a material that is substantially unreactive to radicals. For example, the surfaces 302, 304 may be composed of or coated with AlN, $SiO_2$, $Y_2O_3$, MgO, anodized $Al_2O_3$, sapphire, ceramic containing one or more of $Al_2O_3$, sapphire, AlN, $Y_2O_3$, MgO, or plastic. If a coating is used, the thickness of the coating may be between about 1 µm and about 1 mm. A plurality of holes 224 may be formed in the dual-channel showerhead 218. The holes 224 may extend from the first surface 302 to the second surface 304, and radicals generated from the radical source 204 may pass through the holes 224 to reach the substrate disposed on the support assembly 232. The internal volume 306 may surround the plurality of holes 224 and one or more annular channels 308, 310 may surround the internal volume 306 and the plurality of holes 224.

The internal volume 306 may be in fluid communication with the one or more annular channels 308, 310. The plurality of openings 226 may extend from the internal volume 306 to the second surface 304. The one or more annular channels 308, 310 may be connected to an inlet 312, which is coupled to the gas source 221. The gas source 221 may provide a precursor gas, such as a silicon-containing gas, oxygen-containing gas, and/or nitrogen-containing gas to the dual-channel showerhead 218, and the precursor gas flows through the one or more annular channels 308, 310 to the internal volume 306, and to the processing region 228 via the plurality of openings 226.

Since the openings in the plurality of holes 224 are not in fluid communication with the internal volume 306, the radicals passing through the plurality of holes 224 are not mixed with the precursor gas in the dual-channel showerhead 218. Because the showerhead 218 contains one or more channels that are not in fluid communication of each other, the showerhead 218 is a dual-channel showerhead 218. However, showerhead 218 may contain more than two channels which may also be described as a dual-channel showerhead. The plurality of holes 224 each has an inside diameter of about 0.10 in to about 0.35 in. The plurality of openings 226 each has a diameter of about 0.01 in to about 0.04 in.

The one or more annular channels 308, 310 may be connected by one or more connecting channels 316 that have a smaller cross section than the annular channels 308, 310. This configuration helps the precursor gas to be distributed evenly into the internal volume 306 and out of the openings 226. However, if radicals are to enter the inlet 312, the radicals may recombine when flowing from the large annular channel 308 to the smaller connecting channels 316. In order to provide a path for radicals that are distinct from the radicals formed in the radical source 204, a second inlet 314 is formed in the dual-channel showerhead 218, and the second inlet 314 is connected to the internal volume 306, bypassing the one or more annular channels 308, 310. The second inlet 314 may be distinct from the first inlet 312, and may be configured to direct radicals from the radical source 219 to the internal volume 306 without passing through the one or more annular channels 308, 310.

The processing conditions during surface treatment using apparatus 200 may be as follows. The temperature of processing chamber 202 may be maintained between about 50° C. and 800° C., such as between about 100° C. and about 600° C. The pressure of the processing chamber 202 may be maintained between about 10 mTorr and about 20 Torr, such as between about 0.5 Torr and about 8 Torr. The at least one silicon-containing, nitrogen-containing, and/or oxygen-containing precursor gas may be introduced into the processing region 228 at a flow rate ranging from about 0.1 sccm to about 10,000 sccm for a 300 mm substrate. Alternatively or in addition, these radical-forming gases may be introduced into the radical source 204 at a flow rate ranging from about 1 sccm to about 50,000 sccm for a 300 mm substrate. If used, the flow rate of the carrier gases may range from about 1 sccm to about 50,000 sccm for a 300 mm substrate. Alternatively or in addition to dual-channel showerhead 218, radicals may be generated by the radical source 204. For example, if the radical source 204 is a capacitively coupled remote plasma source, the radicals may be generated from an RF power of between about 50 W and about 15,000 W for a 300 mm substrate, such as an RF power from about 2,000 W to about 10,000 W.

After a surface treatment, the more uniform the pillars of the treated substrate's surface, stictional forces between pillars and surface roughness are reduced compared to the pillars and overall surface of the substrate before treatment. Line bending and surface roughness may be monitored by microscopy, such as scanning electron microscopy and tunneling electron microscopy. However, other microscopy techniques may also be used to monitor line bending. Using such techniques, line bending can be monitored by calculating the standard deviation of the distance between adjacent pillar islands and/or recesses. For example, the average and standard deviation of twenty dies across the substrate may be calculated. A lower standard deviation means that line bending is lower in comparison to a substrate die with a higher standard deviation value. Herein, uniformity refers to the standard deviation of distance between islands and/or spaces between the pillars. If uniformity of islands/recesses across the substrate surface is high, then there will be less line bending.

According to implementations of the present disclosure, surface treatment as described herein modulates the FCVD fill profile meniscus and reduces the capillary force between adjacent pillars upon, for example, a subsequent FCVD process. Reducing surface reactivity of the surface of the substrate reduces the stiction between adjacent pillars of the substrate and allows a subsequent FCVD process to fill gaps between adjacent pillars with reduced line bending before and during such an FCVD process. Accordingly, the surface treatment according to implementations of the present disclosure can modulate both the initial deposition roughness of the treated layer and a subsequent FCVD layer deposited onto the treated layer.

Alternatively or in addition to the aforementioned surface treatment, a flowable layer may be formed over a treated or untreated substrate by a flowable or a flow-like CVD process. The flowable layer is typically formed in a blanket fashion, filling the recesses of the patterned substrate and covering the raised portions of the patterned substrate. The flowable layer may be an oxide layer.

Deposited dielectric films are typically more flowable at lower plasma powers and shift from flowable to conformal when the plasma power is increased. For example, an argon containing plasma maintained in processing region 228 may produce a more flowable silicon oxide layer as the plasma power is decreased from about 1000 Watts to about 100 Watts or lower (e.g., about 900, 800, 700, 600, or 500 Watts or less), and a more conformal layer as the plasma power is increased from about 1000 Watts or more (e.g., about 1000, 1100, 1200, 1300, 1400, 1500, 1600, 1700 Watts or more). As the plasma power increases from low to high, the transition from a flowable to conformal deposited film may be relatively smooth and continuous or progress through relatively discrete thresholds. The plasma power (either alone or in addition to other deposition parameters) may be adjusted to select a balance between the conformal and flowable properties of the deposited film.

An example process for forming an oxide layer over the patterned substrate includes reaction of an organosilicon precursor and an oxygen precursor at a temperature of about 100° C. or less to form a flowable oxide layer. Suitable organosilicon precursors have a ratio of carbon atoms to silicon atoms less than 8. Suitable organosilicon compounds may also have a ratio of oxygen to silicon atoms of 0 to about 6, and may include an Si—O—Si linkage that facilitates formation of $SiO_x$ films with reduced contamination from carbon and hydroxyl groups.

Suitable organosilicon compounds may be siloxane compounds, such as triethoxysiloxane, tetramethoxysiloxane, trimethoxysiloxane, hexamethoxy-disiloxane, octamethoxytrisiloxane, and/or octamethoxydodecasiloxane, silazoxane compounds having one or more nitrogen groups, such as hexamethoxydisilazoxane, methyl hexamethoxydisilazoxane, chlorohexa-methoxydisilazoxane, hexaethoxy-disilazoxane, nonamethoxytrisilazoxane, and octamethoxycyclosilazoxane, halogenated siloxane compounds that include one or more halogen moieties (e.g., fluoride, chloride, bromide, or iodide), such as tetrachlorosilane, dichlorodiethoxysiloxane, chlorotriethoxysiloxane, hexachlorodisiloxane, and/or octachlorotrisiloxane, and aminosilanes, such as trisilylamine, hexamethyldisilazane, silatrane, tetrakis(dimethylamino)silane, bis(diethylamino) silane, tris(dimethyl-amino)chlorosilane, and methylsilatrane. Suitable organosilicon compounds may also be disilanes, such as alkoxy disilanes, alkoxy-alkyl disilanes, and alkoxy-acetoxy disilanes, including compounds having the general structure:

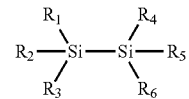

wherein $R_1$-$R_6$ may be, independently, a $C_{1-3}$ alkoxy group, a $C_{1-3}$ alkyl group, or an acetoxy group, wherein at least one of $R_{1-6}$ is an alkoxy group or an acetoxy group. Suitable organosilicon compounds also include cyclic disilanes with alkyl and alkoxy moieties, such as butasilanes, pentasilanes, hexasilanes, heptasilanes, octasilanes, and the like, having at least one alky and alkoxy group. Examples include octamethyl-1,4-dioxa-2,3,5,6-tetrasilacyclohexane; 1,4-dioxa-2,3, 5,6-tetrasilzcyclo-hexane; and 1,2,3,4,5,6-hexamethoxy-1,2, 3,4,5,6-hexamethylcyclohexasilane, among other alkoxy-alkylcyclosilanes. Suitable organosilicon compounds also include organocyclosilanes such as cyclobutasilane, cyclopentasilane, cyclohexasilane, cycloheptasilane, cyclooctasilane, and other similar compounds.

The oxygen precursor may include molecular oxygen ($O_2$), ozone ($O_3$), a nitrogen-oxygen compound such as NO, $NO_2$, or $N_2O$, a hydrogen-oxygen compound such as water or peroxide, a carbon-oxygen compound such as carbon monoxide or carbon dioxide, and other oxygen-containing precursors. The oxygen precursor may also include atomic oxygen and/or oxygen radicals that are generated remotely and introduced with the organosilicon precursor. A carrier gas, such as helium, neon, argon, and/or hydrogen may be mixed with the organosilicon precursor, the oxygen precursor, or both, if desired. The oxygen precursor may be activated prior to introduction to the deposition chamber, for example using a remote plasma source, which may include thermal dissociation, ultraviolet light dissociation, RF, DC, and/or microwave dissociation. In one embodiment, 4-6 kW of RF power may be coupled into a flow of 900-1,800 sccm of argon and 600-1,200 sccm of molecular oxygen. The heating temperature may range between room temperature to about 1100° C.

The organosilicon precursor and the oxygen precursor are typically introduced to a deposition chamber by different pathways to avoid reactions outside the deposition chamber. The organosilicon precursor may be introduced as a gas to the deposition chamber at a liquid-equivalent flow rate of about 800 mgm to about 1,600 mgm. Helium may be included as a carrier gas at a flow rate of about 600 sccm to about 2,400 sccm. An activated oxygen precursor may be introduced to the deposition chamber at a flow rate between about 3 sLm and about 20 sLm. The precursors react to deposit a flowable oxide layer on a substrate having a patterned resist material. The flowable oxide flows to fill the recesses in the patterned substrate. In one embodiment, a flowable oxide layer, which may be silicon oxide, is deposited to a thickness of 200-400 Å to cover the raised portions of the material.

The organosilicon precursor may be used to form a flowable layer at a processing temperature between about −10° C. and about 150° C., such as between about 30° C. and about 100° C., for example about 65° C., and pressure of about 0.5 Torr to about 10 Torr. The organosilicon precursor may be provided at a flow rate between about 10 sccm and about 1800 sccm, such as between about 600 sccm and about 1600 sccm, for example about 1400 sccm. The oxygen precursor may be provided at a flow rate between about 10 mgm and about 1,500 mgm, for example about 1,000 mgm.

A nitrogen-based radical precursor may also be provided to a radical source at a flow rate between about 600 sccm and about 1,250 sccm, for example about 800 sccm. Introducing nitrogen radicals, for example, to the processing region 228 during flowable SiO layer formation reduces stiction of adjacent pillars of the substrate during the deposition, improves capillary forces and surface roughness of the deposited SiO film. Flow rates at the higher values of the aforementioned ranges for both silyl gas and radical gas improves flowability of the film, line bending of the substrate, and roughness and mechanical strength of the deposited FCVD film. In some embodiments, the ratio of organosilicon precursor flow rate to nitrogen-based radical flow rate may be from about 1:1 to about 10:1, for example about 2:1. The nitrogen-based radical gas may be derived from, for example, ammonia.

Similarly beneficial results may be obtained with relatively reduced flow rates of the nitrogen-based radicals (e.g., 600 sccm) when the flowable SiO film is deposited onto a substrate that has undergone surface treatment as described above.

Similarly beneficial results are obtained when silicon-based and oxygen-based radicals are supplied to processing region 228 instead of or in addition to nitrogen-based radicals. Sources of silicon-based and oxygen-based radicals may be derived from the silicon-based and oxygen-based precursors for surface treatment as described above. Similar processing conditions may utilized for the silicon-based and oxygen-based radical FCVD processes as the conditions for the nitrogen-based radical FCVD processes. Similarly beneficial results are also obtained when other silane gases are used as the source of the deposited flowable film (i.e., the flowable dielectric film does not have to be an SiO film).

The flowable layer is typically cured following deposition to remove moisture and residual organics, harden, and densify the layer. The curing is typically performed using low temperature processes that maintain the magnetically active material at a temperature of about 100° C. or less. Such processes include exposure to inductively coupled plasma, ultraviolet light, ozone, e-beam, acidic or basic vapors, an aqueous environment such as heated deionized water, and a combination or succession of such treatments. To facilitate curing, the flowable oxide layer may be heated to a temperature of about 150° C. or less by surface heating methods. Such surface heating methods include exposure to infrared or heat lamps and proximity to a hot chamber surface, such as a showerhead. If the substrate is positioned on a substrate support with capability to cool the magnetically active material, the flowable oxide layer may be heated to higher temperatures, depending on the cooling capacity of the substrate support.

In other embodiments, curing the oxide layer may be performed by heating the substrate using a heat source applied to the surface of the substrate opposite the oxide layer. For example, the substrate may be disposed on a heated substrate support, and to cure the oxide layer the substrate may be heated to a temperature between about 100° C. and about 150° C. by heating the substrate support.

The flowable oxide layer used herein may be partially cured, if desired, to reduce curing time or to achieve certain desired properties of the cured oxide layer. It is typically desired that the flowable oxide layer be cured to an extent sufficient to allow a pattern to be formed and maintained by the cured oxide layer without flowing. If curing is expressed as a percentage referring to moisture plus organics remaining in the layer after curing divided by original moisture plus organics, with 0% referring to an uncured layer, such as a flowable oxide layer as deposited, and 100% referring to a layer that has been cured to the extent that all moisture and organics have been removed, the flowable oxide layer used herein is typically cured to at least about 40%, such as between about 50% and about 95%, for example about 90%.

In some embodiments, films may be formed by, for example, FCVD onto a surface treated or untreated film surface. Such films may include but are not limited to silicon-containing films. For example, a film may be deposited composed of SiC, SiO, SiCN, $SiO_2$, SiOC, SiOCN, SiON and/or SiN. The composition of the films depends on the composition of the precursor gases. SiC films may be deposited, for example, by using (dimethyl-silyl)(trimethylsilyl)methane, hexamethyldisilane, and/or trimethylsilane. $SiO/SiO_2$ films may be deposited, for example, by using TEOS and/or disiloxane. SiCN films may be deposited, for example, by using tris(dimethylamino)silane, bis(dimethylamino)methylsilane, and/or (dimethylamino)dimethylsilane. SiOC films may be deposited, for example, by using tris(dimethylamino)silane, bis(dimethylamino)methylsilane, (dimethylamino)di-methylsilane, tris(dimethyl-amino) silane, bis(dimethylamino)methylsilane, and/or (dimethylamino)di-methylsilane. SiOCN films can be formed, for example, by using tris(dimethylamino)silane, bis(dimethylamino)methylsilane, and/or (dimethylamino)dimethylsilane. SiON films can be formed, for example, by using disiloxane or trisilylamine. SiN films may be deposited, for example, by using trisilylamine (TSA) and/or silane.

A flowable or flow-like layer may be formed using a high-density plasma CVD system, a plasma enhanced CVD system, and/or a sub-atmospheric CVD system, among other systems. Examples of CVD systems capable of forming a flowable or flow-like oxide layer include the ULTIMA HDP CVD® system and ETERNA CVD® on the PRODUCER® system, both available from Applied Materials, Inc., of Santa Clara, Calif. Other similarly configured CVD systems from other manufacturers may also be used.

Figure 4A:
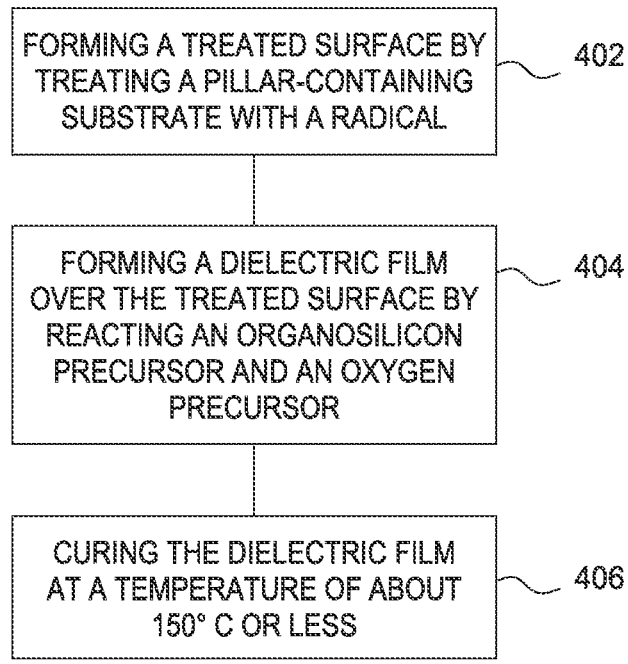
FIGS. 4A-4B are process flow diagrams each illustrating a method according to another implementations.

FIG. 4A is a process flow diagram illustrating a method according to another embodiment. As shown in FIG. 4A, a method of reducing line bending and surface roughness of a substrate with pillars includes forming a treated surface by treating a pillar-containing substrate with a radical. (Block 402). As described above, forming a treated surface by treating a pillar-containing substrate with a radical may be performed at a temperature between about 50° C. and about 800° C. at a pressure between about 10 mTorr and about 20 Torr. The radical may be silicon-based, nitrogen-based or oxygen-based and the radical may be introduced into a processing region at a flow rate between about 0.1 sccm and about 10,000 sccm. The method may include forming a dielectric film over the treated surface by reacting an organosilicon precursor and an oxygen precursor (Block 404). Forming a dielectric film over the treated surface by reacting an organosilicon precursor and an oxygen precursor may be performed at a temperature of about 100° C. or less at a pressure between about 0.5 Torr and about 10 Torr. The organosilicon precursor may be introduced into a processing region at a flow rate between about 10 sccm and about 1800 sccm, and the oxygen precursor may be introduced into the processing region at a flow rate between about 10 mgm and about 1,500 mgm. The method may include curing the dielectric film at a temperature of about 150° C. or less (Block 406). Embodiments of the present disclosure improve surface roughness of a substrate and overall line bending of substrate pillars by ameliorating capillary forces as well as stiction between adjacent pillars.

Figure 4B:
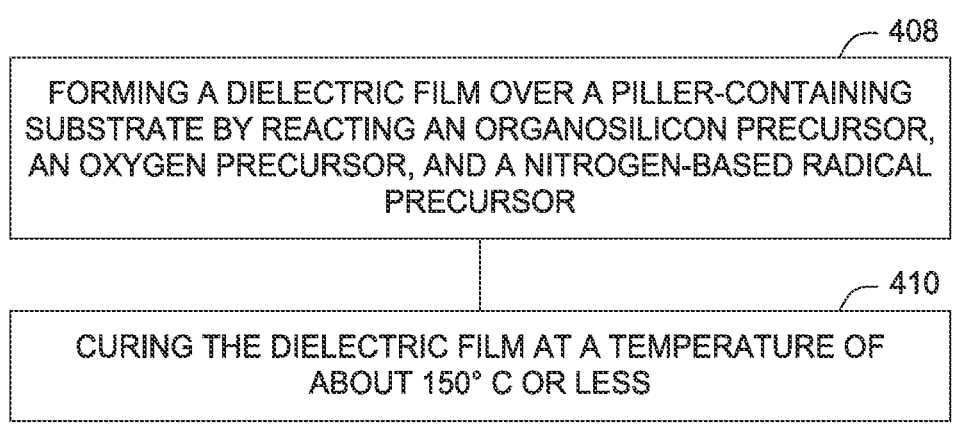

FIG. 4B is a process flow diagram illustrating a method according to another embodiment. As shown in FIG. 4B, a method of reducing line bending and surface roughness of a substrate with pillars includes forming a dielectric film over a pillar-containing substrate by reacting an organosilicon precursor, an oxygen precursor, and a radical precursor (Block 408). The forming a dielectric film over a pillar-containing substrate may be performed at a temperature of about 100° C. or less at a pressure between about 0.5 Torr and about 10 Torr. The organosilicon precursor may be introduced into a processing region at a flow rate between about 10 sccm and about 1800 sccm. The oxygen precursor may be introduced into the processing region at a flow rate between about 10 mgm and about 1,500 mgm. The radical precursor may be introduced to a radical source at a flow rate between about 600 sccm and about 1,250 sccm. The method may include curing the dielectric film at a temperature of about 150° C. or less (Block 410). The radical precursor may be selected from the group consisting of nitrogen-based radical precursor, oxygen-based radical precursor, and silicon-based radical precursor.

Implementations of the present disclosure improve surface roughness of a substrate and overall line bending of substrate pillars by ameliorating capillary forces as well as stiction between adjacent pillars. Implementations of the present disclosure also improve flowability of a deposited flowable film.

While the foregoing is directed to implementations of the present disclosure, other and further implementations of the present disclosure may be devised without departing from the basic scope thereof, and the scope thereof is determined by the claims that follow.

The invention claimed is:

1. A method of reducing line bending and surface roughness of a substrate with pillars, comprising:
    forming first radicals and ions in a remote plasma system that is a radical source;
    controlling flow of ions toward the pillar-containing substrate via a radical distribution plate configured to filter ions;
    forming second radicals in a dual-channel showerhead, wherein the first radicals and the second radicals are independently silicon-based, nitrogen-based or oxygen-based;
    forming a treated surface by treating the pillar-containing substrate with the first radicals and the second radicals;
    forming a dielectric film over the pillar-containing substrate by reacting an organosilicon precursor, an oxygen precursor, and at least one of the first and second radicals at a temperature of about 100° C. or less at a pressure between about 0.5 Torr and about 10 Torr, wherein the organosilicon precursor is introduced into a processing region at a flow rate between about 10 sccm and about 1800 sccm, the oxygen precursor is introduced into the processing region at a flow rate between about 10 mgm and about 1,500 mgm, and a radical precursor is introduced to the radical source at a flow rate between about 600 sccm and about 1,250 sccm; and
    curing the dielectric film at a temperature of about 150° C. or less, wherein the radical precursor is selected from the group consisting of nitrogen-based radical precursor, oxygen-based radical precursor, and silicon-based radical precursor.

2. The method of claim 1, wherein the organosilicon precursor is selected from the group consisting of triethoxysiloxane, tetramethoxysiloxane, trimethoxysiloxane, hexamethoxydisiloxane, octamethoxytrisiloxane, and octamethoxydodecasiloxane.

3. The method of claim 1, wherein the organosilicon precursor is a silazoxane selected from the group consisting of hexamethoxydisilazoxane, methyl hexamethoxydisilazoxane, chlorohexamethoxydisilazoxane, hexaethoxydisilazoxane, nonamethoxytrisilazoxane, and octamethoxycyclosilazoxane.

4. The method of claim 1, wherein the organosilicon precursor is a halogenated siloxane selected from the group consisting of tetrachlorosilane, dichlorodiethoxysiloxane, chlorotriethoxysiloxane, hexachlorodisiloxane, and octachlorotrisiloxane.

5. The method of claim 1, wherein the organosilicon precursor is an aminosilane selected from the group consisting of trisilylamine, hexamethyldisilazane, silatrane, tetrakis(dimethylamino)silane, bis(diethylamino)-silane, tris(dimethylamino)chlorosilane, and metylsilatrane.

6. The method of claim 1, wherein the organosilicon precursor is a disilane selected from the group consisting of alkoxy disilanes, alkoxy-alkyl disilanes, and alkoxy-acetoxy disilanes, consisting of compounds having the general structure

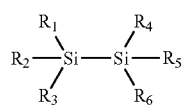

where $R_1$-$R_6$ may be, independently, a $C_{1-3}$ alkoxy group, a $C_{1-3}$ alkyl group, or an acetoxy group, wherein at least one of $R_{1-6}$ is an alkoxy group or an acetoxy group.

7. The method of claim 1, wherein the organosilicon precursor is a cyclic silane selected from the group consisting of octamethyl-1,4-dioxa-2,3,5,6-tetrasilacyclohexane, 1,4-dioxa-2,3,5,6-tetrasilzcyclohexane, and 1,2,3,4,5,6-hexamethoxy-1,2,3,4,5,6-hexamethylcyclohexasilane, cyclobutasilane, cyclo-pentasilane, cyclohexasilane, cycloheptasilane, and cyclooctasilane.

8. The method of claim 1, wherein the oxygen precursor is selected from the group consisting of oxygen, ozone, NO, $NO_2$, $N_2O$, water, peroxide, carbon monoxide and carbon dioxide.

9. The method of claim 1, wherein the organosilicon precursor, the oxygen precursor, and the at least one of the first and second radicals are reacted at a temperature of about 65° C.

10. The method of claim 1, wherein the ratio of the flow rate of the organosilicon precursor to the flow rate of the radical precursor is between about 1:1 and about 10:1.

11. The method of claim 1, wherein the radical precursor is a silicon-based radical precursor and is selected from the group consisting of (dimethylsilyl)(trimethylsilyl)methane, hexamethyldisilane, trimethylsilane, trimethylsilylchloride, tetramethylsilane, tetraethoxysilane, tetramethoxysilane, tetrakis-(trimethylsilyl)silane, (dimethylamino)dimethylsilane, dimethyldiethoxysilane, dimethyldimethoxysilane, methyltrimethoxysilane, dimethoxytetramethyl-disiloxane, tris(dimethylamino)silane, bis(dimethylamino)methylsilane, and disiloxane.

12. The method of claim 1, wherein the radical precursor is an oxygen-based radical precursor and is selected from the group consisting of oxygen, $H_2O$, and hydrogen peroxide.

13. The method of claim 1, wherein the radical precursor is ammonia.

* * * * *